(12) United States Patent
Sakai et al.

(10) Patent No.: US 7,851,708 B2
(45) Date of Patent: Dec. 14, 2010

(54) COMPOSITE SUBSTRATE AND METHOD FOR MANUFACTURING COMPOSITE SUBSTRATE

(75) Inventors: Norio Sakai, Moriyama (JP); Mitsuyoshi Nishide, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 171 days.

(21) Appl. No.: 12/186,546

(22) Filed: Aug. 6, 2008

(65) Prior Publication Data

US 2008/0289853 A1 Nov. 27, 2008

Related U.S. Application Data

(63) Continuation of application No. PCT/JP2006/319262, filed on Sep. 28, 2006.

(51) Int. Cl.
H05K 1/03 (2006.01)
(52) U.S. Cl. .................................. 174/255; 174/260
(58) Field of Classification Search ................. 174/255, 174/260, 262
See application file for complete search history.

(56) References Cited

U.S. PATENT DOCUMENTS 7,090,502 B2 * 8/2006 Ono et al. ................. 439/65

FOREIGN PATENT DOCUMENTS

| JP | 06-216314 A | 8/1994 |
|---|---|---|
| JP | 07-50357 A | 2/1995 |
| JP | 09-148743 A | 6/1997 |
| JP | 2000-101348 A | 4/2000 |
| JP | 2001-339137 A | 12/2001 |
| JP | 2004289193 A * | 10/2004 |
| JP | 2005-328009 A | 11/2005 |
| WO | 2006/027888 A1 | 3/2006 |

OTHER PUBLICATIONS

Official Communication issued in International Patent Application No. PCT/JP2006/319262, mailed on Dec. 19, 2006.

* cited by examiner

*Primary Examiner*—Ishwarbhai B Patel
(74) *Attorney, Agent, or Firm*—Keating & Bennett, LLP

(57) ABSTRACT

In a composite body, a frame body includes a frame member and a plurality of connection members formed by bending thin metal plates. The frame member includes a through-hole and extends along a peripheral portion of a substrate body. Each of the plurality of connection members has a first strip and a second strip continuously connected to opposed ends of a middle strip. The connection members are disposed in the frame member. Each of the first and second strips of the connection member is exposed on a major surface extending around the through-hole. The first strip and the second strip extend in a direction in which the connection members face each other, and opposed ends of the middle strip are continuously connected to the first strip and the second strip on the side adjacent to the through-hole. The middle strip extends through the inside of the frame member.

15 Claims, 9 Drawing Sheets

COMPOSITE SUBSTRATE AND METHOD FOR MANUFACTURING COMPOSITE SUBSTRATE

BACKGROUND OF THE INVENTION

1. Field of the Invention

The present invention relates to a composite substrate and a method for manufacturing the composite substrate and, in particular, to a composite substrate having a plate substrate body and a frame connected to a first major surface of the substrate body and a method for manufacturing the composite substrate.

2. Description of the Related Art

In order to highly densely mount electronic components, a module component having chip electronic components mounted on two sides or one side of a substrate body is available. In order to raise the substrate body of the module component from another circuit substrate when the module component is mounted on the circuit substrate, a frame member or a package is attached to the substrate body of the module component. In such a case, in order to electrically connect the substrate body with another circuit substrate, an interconnection line pattern is provided on the frame member or the package. One end of the interconnection pattern is connected to the substrate body, while the other end of the interconnection pattern is connected to the other circuit substrate (refer to, for example, Japanese Unexamined Patent Application Publication No. 6-216314, Japanese Unexamined Patent Application Publication No. 7-50357, Japanese Unexamined Patent Application Publication No. 2000-101348, and Japanese Unexamined Patent Application Publication No. 2001-339137).

In addition, Japanese Unexamined Patent Application Publication No. 2005-333046 describes a substrate connection member having a lead terminal that protrudes from a housing of the substrate connection member and that is used to connect module substrates. By using the spring elasticity of the protruding lead terminal, resistance to shock is improved.

Figure 16A:
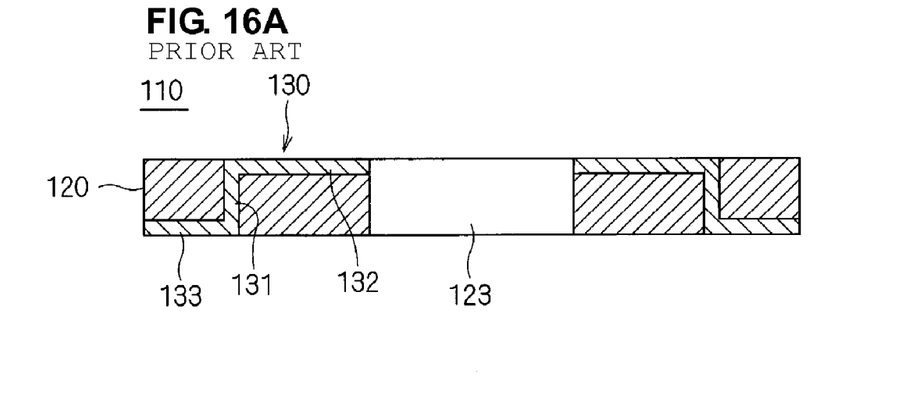
FIGS. 16A to 16C are cross-sectional views of a chip package according to the related art.

Furthermore, Japanese Unexamined Patent Application Publication No. 2005-328009 describes a technology in which, as shown in FIG. 16A, a lead frame 130 is insert-molded on a plate-like resin substrate 120, a middle strip 131 of the lead frame 130 is embedded inside the resin substrate 120, and either end portion of the lead frame 130 is bent so that a chip package 110 having lead portions 132 and 133 exposed on the upper and lower surfaces of the resin substrate 120 is provided.

Figure 16B:
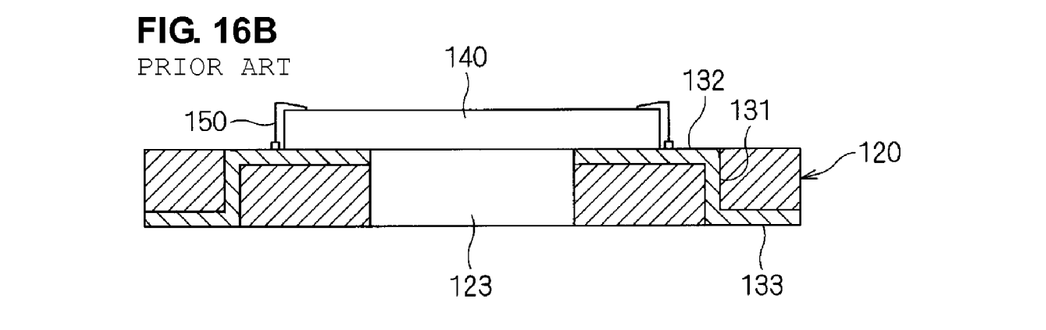

As shown in FIG. 16B, the chip package 110 includes a chip 140 mounted on an upper surface of the resin substrate 120 so as to bridge over an opening 123. The chip 140 is connected to the lead portion 132 using a bonding wire 150.

Figure 16C:
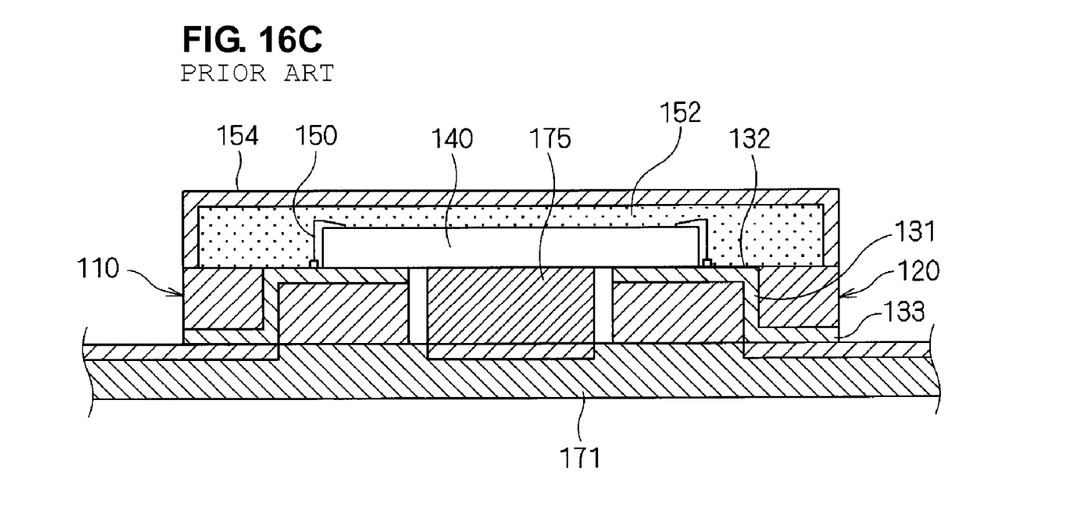

In addition, as shown in FIG. 16C, a resin sealer 152 is applied to the upper surface of the chip package 110 so as to seal the chip 140. Thereafter, a box-shaped cover 154 having an open bottom is disposed over the chip package 110. The box-shaped cover 154 is then secured to the resin substrate 120 so that a semiconductor device is provided. The semiconductor device is mounted on a printed substrate 171.

If the coefficients of thermal expansion or the linear coefficients of expansion of the substrate body of the module component and another circuit substrate having the module component mounted thereon are different, a thermal stress occurs in a connection portion between the interconnection line pattern provided on the frame member and the package due to a temperature change. In addition, a shock stress caused by a dropping shock may be applied. In particular, if the module component is used in a severe environment, the thermal stress and the shock stress increase, and therefore, the connection reliability significantly decreases.

Since the substrate connection member described in Japanese Unexamined Patent Application Publication No. 2005-333046 has a protruding portion of a lead terminal that is located in the air, it is difficult to accurately connect the lead terminal to a module substrate. In addition, the structure is complicated.

The chip package described in Japanese Unexamined Patent Application Publication No. 2005-328009 includes a chip mounted thereon and connected thereto using a bonding wire. The chip is not coupled to a substrate body. Japanese Unexamined Patent Application Publication No. 2005-328009 neither describes nor suggests the shape of a lead frame that reduces a thermal stress and a shock stress.

SUMMARY OF THE INVENTION

To overcome the problems described above, preferred embodiments of the present invention provide a composite substrate capable of reducing a thermal stress and a shock stress applied to a connection portion using a simple structure and a method for manufacturing the composite substrate.

A composite substrate according to a preferred embodiment of the present invention includes a substrate body having a terminal disposed on at least a first major surface thereof and a frame body connected to the first major surface of the substrate body. The frame body includes a frame member that is made of an insulating material, that has a through-hole at the approximate center thereof, and that extends along the peripheral portion of the first major surface of the substrate body so as to have a frame shape, and a plurality of connection members each formed by bending a thin metal plate so as to have a first strip and second strip continuously connected to either end of a middle strip. The plurality of connection members are arranged such that the plurality of connection members face the frame member with the through-hole of the frame member therebetween, the first strip is exposed on the frame member towards the substrate body and is connected to the terminal disposed on the first major surface of the substrate body, the second strip is exposed on the frame member to the side remote from the substrate body, the first and second strips extend in a direction in which the connection members face each other with the through-hole therebetween, the middle strip extends through the inside of the frame member, and the ends of the middle strip are continuously connected to an end of the first strip and an end of the second strip on the side adjacent to the through-hole of the frame member.

In the above-described structure, the second strip of the connection member of the composite substrate is connected to an external circuit board. At that time, the connection member having the first and second strip whose ends on the same side are continuously connected to either end of the middle strip can reduce a thermal stress and a shock stress caused by a temperature change and a shock and applied to connection portions between the composite substrate and the external substrate and between the substrate body and the frame body by elastic deformation thereof. As a result, the connection reliability is increased.

In the above-described structure, the distance between the middle strips of the connection members facing each other with the through-hole of the frame member therebetween is reduced, as compared to the case where the other end of the first strip and the other end of the second strip (the ends on the side of the frame body remote from the through-hole, that is, on the outer side) are continuously connected to the middle strip. Accordingly, a thermal stress and a shock stress applied to the connection portions are reduced. As a result, the connection reliability is increased, as compared to the case where the other end of the first strip and the other end of the second strip (the ends on the side remote from the through-hole of the frame body, that is, on the outer side) are continuously connected to the middle strip.

It is preferable that the chip electronic component is disposed in the through-hole of the frame member and is mounted on the first major surface of the substrate body.

In such a case, by using the through-hole of the frame member, the package density of the composite substrate can be increased.

It is preferable that the chip electronic component is sealed with a resin, and the resin is bonded to or in contact with a portion of the frame body.

In this case, the flow of the resin can be blocked by the frame body so that the chip electronic component is reliably sealed. In addition, the resin used for sealing prevents deformation of the frame body and increases the strength of the connection between the frame body and the substrate body.

It is preferable that the connection members in the frame body are formed by a stamping process and a bending process of a thin metal plate, and the frame member of the frame body is formed from a resin molded with the connection members inserted in a die.

In this way, the frame body can be efficiently manufactured.

It is preferable that the substrate body is a ceramic substrate.

Since a ceramic substrate has a low coefficient of thermal expansion, thermal stress applied to the connection portion when the ceramic substrate is mounted on the external circuit board increases. Accordingly, the reliability of the connection can be significantly increased.

It is preferable that the substrate body is a ceramic multilayer substrate including a plurality of stacked ceramic layers which can be fired at a temperature of about 1,050° C. or less, for example.

In this case, the package density of the composite substrate can be increased by using a ceramic multilayer substrate. At the same time, the reliability of the connection can be significantly increased. In addition, although a ceramic multilayer substrate is more fragile than other types of substrate, damage to the ceramic multilayer substrate caused by a thermal stress and a shock stress can be effectively prevented.

It is preferable that the thin metal plate of the connection member of the frame body has flexibility.

If the thin metal plate of the connection member has flexibility, the first strip and the second strip of the connection member are pivotable about the bent portions. Accordingly, the connection strength between the frame body and the substrate body and the connection strength between the frame body and the external circuit board can be increased.

It is preferable that the thickness of the connection member be in the range of about 50 μm to about 300 μm, for example.

If the thickness of the connection member is in this range, the connection member can be accurately processed. Therefore, the size of the connection member can be easily reduced. That is, if the thickness of the connection member is less than about 50 μm, the number of variations occurring in a bending process increases, and therefore, the accuracy of the locations and heights of the first and second strips of the connection member decreases. In addition, fatigue breakage easily occurs. If the thickness of the connection member is greater than about 300 μm, it is difficult to perform a bending process, and therefore, the bending angle and height vary considerably among the connection members.

It is preferable that a chip electronic component is mounted on a second major surface of the substrate body.

In this case, the package density of the composite substrate can be increased.

It is preferable that a top end of the second strip of the connection member on the frame body extends to an outer peripheral surface of the frame member or extends outwardly beyond the outer peripheral surface of the frame member.

In such a case, the area of the connection portion between the composite substrate and the external circuit board can be increased, and therefore, the connection strength between the composite substrate and the external circuit board can be increased.

It is preferable that a top end portion of the second strip of the connection member on the frame body is bent and extends along an outer peripheral surface of the frame member.

In this case, the connection state between the composite substrate and the external circuit board can be easily inspected from the outside.

It is preferable that an area of the first strip of the connection member on the frame body is greater than an area of the second strip.

In this case, by increasing the area of the connection portion between the frame body and the substrate body, the connection strength between the frame body and the substrate body can be increased.

It is preferable that the location of the center of the first strip of the connection member on the frame body is shifted from the location of the center of the terminal of the substrate body towards the through-hole of the frame body.

In this case, a curing contraction stress of a sealing resin occurring when the through-hole of the frame body is filled with the sealing resin and, subsequently, the sealing resin is cured, can be reduced by a curing contraction stress of an electrically conductive connecting material that connects the terminal of the substrate body to the first strip of the connection member, and therefore, an effect caused by the curing contraction stress of the sealing resin can be reduced. As a result, deformation of the frame body caused by the curing contraction of the sealing resin can be prevented, and therefore, the connection reliability between the frame body and the substrate body can be improved. In addition, since a compression stress acts on the substrate body, the deflecting strength of the substrate body can be increased.

It is preferable that the location of an inner edge of the first strip of the connection member on the frame body adjacent to the through-hole of the frame body is shifted from the location of an inner edge of the terminal of the substrate body adjacent to the center of the substrate body towards the through-hole of the frame body.

In this case, an electrically conductive connecting material that connects the terminal of the substrate body to the first strip of the connection member is extended in a region between the inner edge of the terminal and the inner edge of the first strip in the width direction (a direction substantially perpendicular to a joint surface between the substrate body and the frame body) and is cured. Accordingly, a curing contraction stress of the electrically conductive connecting material can be increased. As a result, a curing contraction stress of a sealing resin occurring when the through-hole of the frame body is filled with the sealing resin and, subsequently, the sealing resin is cured can be effectively reduced by the curing contraction stress of the electrically conductive connecting material.

It is preferable that the location of a leading edge of the first strip of the connection member on the frame body remote from the through-hole of the frame body is shifted from the location of an outer edge of the terminal of the substrate body remote from the center of the substrate body towards the through-hole of the frame body.

If the leading edge of the first strip is outwardly shifted from the outer edge of the terminal (towards the outside of the frame body in a direction away from the through-hole), the top end of the first strip is pulled towards the inside of the frame body. Accordingly, the top end of the first strip is separated from the frame member, and therefore, the connection between the frame body and the substrate body may become unstable or the connection strength between the frame body and the substrate body may be decreased. In contrast, if the leading edge of the first strip is inwardly shifted from the outer edge of the terminal (towards the through-hole of the frame body), the top end of the first strip is pulled towards the outside of the frame body. Accordingly, the top end of the first strip is firmly connected to the frame member, and therefore, the connection between the frame body and the substrate body becomes stable. Thus, the connection strength between the frame body and the substrate body becomes stable.

To solve the above-described problems, the present invention further provides a method for manufacturing a composite substrate configured as follows.

A method for manufacturing a composite substrate according to another preferred embodiment of the present invention includes a first step of preparing a substrate body having a terminal on at least a first major surface thereof and a frame body and a second step of connecting the frame body to the first major surface of the substrate body. In the first step, the frame body includes a frame member made of an insulating material, where the frame member has a through-hole at the center thereof and extends along a peripheral portion of the first major surface of the substrate body so as to have a frame shape and where each of the plurality of connection members has a first strip and a second strip continuously connected to ends of a middle strip, and a plurality of connection members formed by bending thin metal plates. The plurality of connection members are disposed in the frame member so that the plurality of connection members face each other with the through-hole of the frame member therebetween, the first and second strips are exposed on either major surface of the frame member extending around the through-hole of the frame member, the first and second strips extend in a direction in which the connection members face each other with the through-hole of the frame member therebetween, the middle strip extends through the inside of the frame member, and ends of the middle strip are continuously connected to an end of the first strip and an end of the second strip on the side adjacent to the through-hole of the frame member. In the second step, the frame body is arranged so that the frame body extends along a peripheral portion of the first major surface of the substrate body and has a frame shape, and the first strip of the connection member on the frame body is connected to the terminal disposed on the first major surface of the substrate body.

In a composite substrate manufactured using the above-described method, the second strip of the connection member is connected to an external circuit board. At that time, the connection member having the first and second strip whose ends on the same side are continuously connected to either end of the middle strip reduces, using elastic deformation thereof, a thermal stress caused by a temperature change and a shock stress caused by a shock which are applied to connection portions between the composite substrate and the external substrate and between the substrate body and the frame body. As a result, the connection reliability can be increased.

In the above-described structure, the distance between the middle strips of the connection members facing each other with the through-hole of the frame member therebetween is reduced, as compared to the case where the other end of the first strip and the other end of the second strip (the ends on the side of the frame body remote from the through-hole, that is, on the outer side) are continuously connected to the middle strip. Accordingly, a thermal stress and a shock stress applied to connection portions can be reduced. As a result, the connection reliability can be increased, as compared to the case where the other end of the first strip and the other end of the second strip (the ends on the side remote from the through-hole of the frame body, that is, on the outer side) are continuously connected to the middle strip.

According to preferred embodiments of the present invention, a thermal stress and a shock stress applied to a connection portion can be reduced using a simple structure, and therefore, the connection reliability can be improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 8A and 8B are cross-sectional views illustrating a manufacturing step of the composite substrate according to a preferred embodiment of the present invention, where FIG. 8A is a cross-sectional view and FIG. 8B is an enlarged cross-sectional view of a main portion.

DETAILED DESCRIPTION OF PREFERRED EMBODIMENTS

Preferred embodiments of the present invention are described below with reference to FIGS. 1 to 13.

A composite substrate 10 is described next with reference to FIGS. 1 to 10.

Figure 1A:
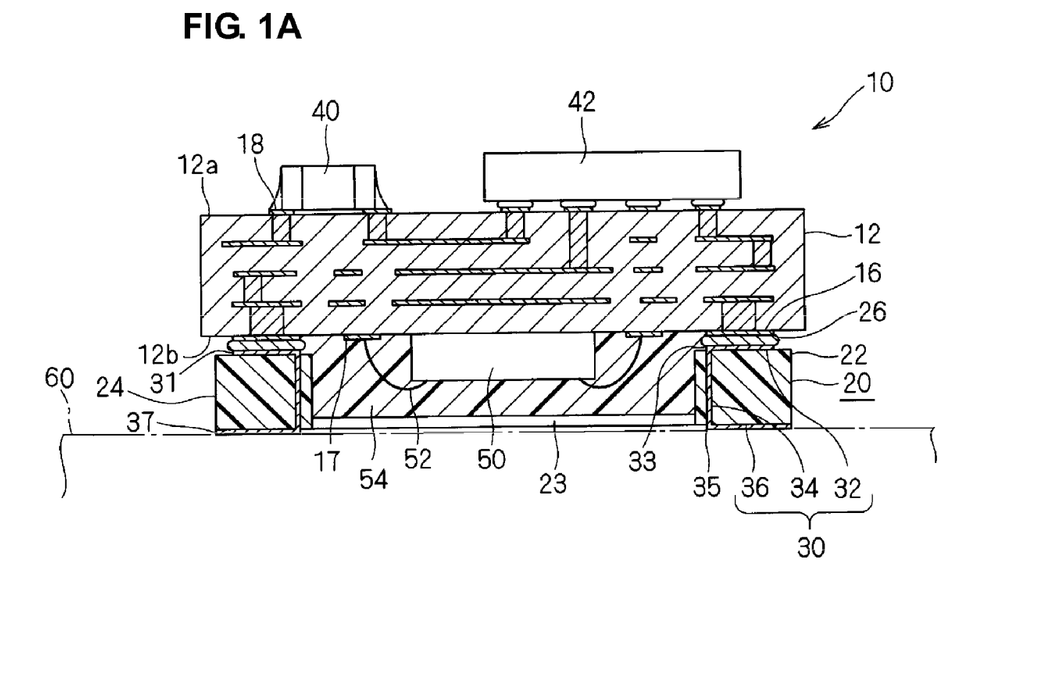
FIGS. 1A and 1B are a cross-sectional view and a bottom view of the entire structure of a composite substrate according to a preferred embodiment of the present invention.
Figure 1B:
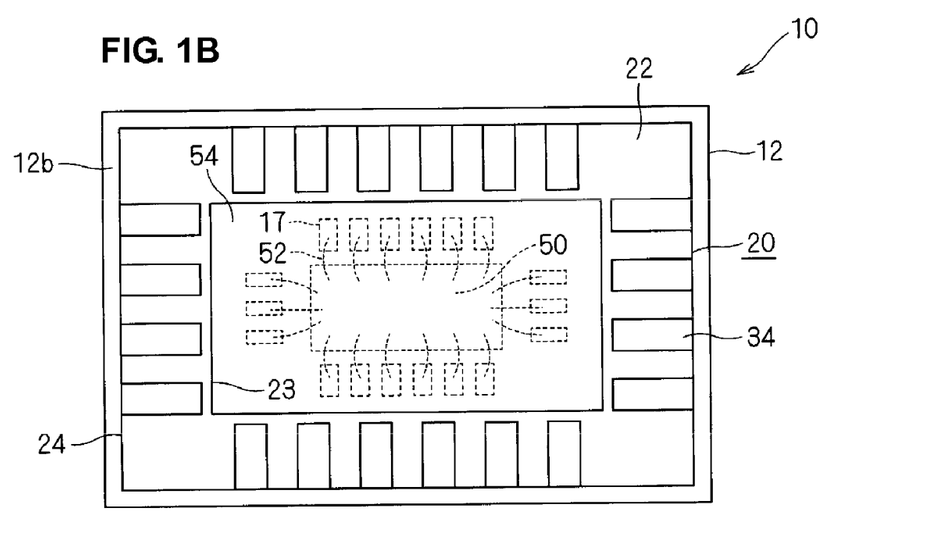

As shown by the cross-sectional view in FIG. 1A and the bottom view in FIG. 1B, the composite substrate 10 includes a plate-shaped substrate body 12 and a frame body 20 connected to a first major surface 12b of the substrate body 12.

A chip electronic component 50, such as an IC chip, is mounted on the first major surface 12b of the substrate body 12. A terminal of the chip electronic component 50 is connected to a pad 17 disposed on the first major surface 12b of the substrate body 12 using a bonding wire 52. Furthermore, a chip electronic component connected using a method other than a wire bonding method may be mounted on the first major surface 12b of the substrate body 12. For example, a surface-mounted device (SMD) may be mounted on the first major surface 12b of the substrate body 12.

Chip electronic components 40 and 42, such as chip capacitors and IC chips, are mounted on a second major surface 12a of the substrate body 12 as required. Terminals of the chip electronic components 40 and 42 are connected to terminals 18 disposed on the second major surface 12a of the substrate body 12 using solder reflow and flip chip bonding.

To achieve high package density, any structure of the substrate body 12 that allows electronic components to be mounted on one side or two sides thereof can be used. For example, the substrate body 12 is preferably a ceramic multilayer substrate including a plurality of stacked ceramic layers. A ceramic multilayer substrate is suitable for the substrate body 12 of the composite substrate 10 since the package density can be increased by forming an electric circuit inside the ceramic multilayer substrate. However, the substrate body 12 is not limited to a ceramic multilayer substrate. For example, the substrate body 12 may be a single-layer ceramic substrate (e.g., an alumina substrate) or a substrate made of a material other than ceramic (e.g., a printed circuit board or a flexible printed circuit board).

The frame body 20 includes a plurality of connection members 30 disposed on a frame member 22. The frame member 22 is made of an insulating material (e.g., a resin).

The frame member 22 includes a through-hole 23 at the approximate center thereof. The frame member 22 extends along a substantially rectangular peripheral portion of the first major surface 12b of the substrate body 12 so as to have a frame shape. The through-hole 23 of the frame member 22 defines a recess portion (a cavity). The first major surface 12b of the substrate body 12 defines a bottom surface of the recess portion. The chip electronic component 50 and the pad 17 are disposed on the first major surface 12b.

To protect the composite substrate 10 from mechanical damage, heat, and moisture, the through-hole 23 of the frame member 22 is filled with a sealer 54, and thus, the chip electronic component 50 is sealed. When the chip electronic component 50 is mounted on the first major surface 12b of the substrate body 12 using solder reflow or the chip electronic component 50 is flip-chip bonded using a bump of Au or solder, the need for the sealer 54 is eliminated.

In addition, the chip electronic components 40 and 42 disposed on the second major surface 12a of the substrate body 12 may be sealed using a sealer, or a metal case may be connected to the second major surface 12a. This structure allows a mounter to easily pick up the composite substrate 10 when the composite substrate 10 is mounted on an external circuit substrate 60. In particular, when a metal case is used for the composite substrate 10 for high-frequency use, the metal case provides an electromagnetic shield effect. If an electromagnetic shield is not required, a heat-curable resin, such as an epoxy resin, can be applied to the upper surfaces of the chip electronic components 40 and 42 so as to cover the chip electronic components 40 and 42 or a transfer molding can be performed. In this manner, the top surface is planarized.

The connection members 30 are disposed on four sides of the frame member 22 so as to face each other with the through-hole 23 of the frame member 22 therebetween. Each of the connection members 30 has a substantially U-shaped cross section. Each of the connection members 30 is formed by bending a strip-shaped thin metal plate at a right angle so that two bent portions 33 and 35 are formed. A first strip 32 and a second strip 36 continuously extend from either end of a middle strip 34. The middle strip 34 passes through the inside of the frame member 22. The first strip 32 extends along the surface of the frame member 22 adjacent to the substrate body 12, while the second strip 36 extends along the surface of the frame member 22 remote from the substrate body 12. The first strip 32 and the second strip 36 are exposed to the outside. The first strip 32 and the second strip 36 extend in a direction in which the connection members 30 face each other with the through-hole 23 therebetween. The ends of the first strip 32 and the second strip 36 on the same side, that is, the ends adjacent to the through-hole 23 of the frame member 22 are connected to either end of the middle strip 34. That is, each of the connection members 30 is disposed so that top ends 31 and 37 of the respective first strip 32 and the second strip 36 are directed to the outside, and the middle strip 34 is disposed on the inner side of the frame member 22.

The first strip 32 and the second strip 36 have different lengths. That is, the top end 37 of the second strip 36 extends to an outer peripheral surface 24 of the frame member 22, while the top end 31 of the first strip 32 does not extend to the outer peripheral surface 24 of the frame member 22.

The first strip 32 of each of the connection members 30 is connected to a terminal 16 disposed on the first major surface 12b of the substrate body 12 using a solder 26. Thus, the frame body 20 is connected to the first major surface 12b of the substrate body 12.

The second strip 36 of each of the connection members 30 is exposed to the outside and is connected to the external circuit substrate 60. In this manner, the composite substrate 10 is mounted on the external circuit substrate 60 and is electrically connected to the external circuit substrate 60. When a metal case is attached to the substrate body 12, the metal case is also electrically connected to the external circuit substrate 60.

It is preferable that the thickness of the thin metal plate used for the connection members 30 be in the range of about 50 μm to about 300 μm, for example.

If the thickness of the thin metal plate used for the connection members 30 is less than about 50 μm, the number of variations occurring during a bending process increases, and therefore, variations in the locations and heights of the first strip 32 and the second strip 36 become more pronounced. The increase in the variations in the locations and heights of the first strip 32 and the second strip 36 decreases the positional accuracy of the frame body 20 and the substrate body 12. In order to reliably connect the frame body 20 to the substrate body 12, the size of the terminal 16 disposed on the substrate body 12 and connected to the first strip 32 needs to be increased, thus allowing a margin for a positional shift of the first strip 32. However, in such a case, the size of the substrate body 12 cannot be reduced, and therefore, the size of the composite substrate 10 cannot be reduced.

If the heights of the first strips 32 and the second strips 36 are not uniform, the thickness of solder disposed, for example, between the substrate body 12 and the frame body 20 and between the frame body 20 and the external circuit substrate 60 varies. Accordingly, the connection reliability is decreased. If a margin for the height is increased in order to compensate for variations in the height, a low-profile composite substrate 10 cannot be achieved.

Furthermore, the bent portions 33 and 35 and portions near the bent portions 33 and 35 of the connection member 30 are placed under cyclic fatigue conditions caused by thermal stress and shock stress. If the thickness is too small, fatigue breakage is likely to occur. Accordingly, the connection reliability is decreased.

If the thickness of the thin metal plate used for the connection members 30 exceeds about 300 μm, it is difficult to perform a bending process, and therefore, the bending angle and height vary considerably among the connection members 30. In addition, the lengths of the first strip 32, the middle strip 34, and the second strip 36 (the sizes in a direction in which the first strip 32, the middle strip 34, and the second strip 36 continuously extend) or the widths of the first strip 32, the middle strip 34, and the second strip 36 (the sizes in a direction substantially perpendicular to the direction in which the first strip 32, the middle strip 34, and the second strip 36 continuously extend) cannot be reduced by reducing the distance between the stamped connection members 30 and between the portion to be bent. Therefore, it is difficult to produce a compact composite substrate 10 or a low-profile composite substrate 10.

In order to increase the wettability of the connection members 30 with respect to a solder or an electrically conductive adhesive used to connect the connection members 30 to the substrate body 12 or the external circuit substrate 60 and, therefore, to increase the connection strength, Ni/Sn, Ni/Au, or Ni/solder, for example, may be plated on the connection members 30. Plating may be performed over substantially the entire connection member 30 or over only the connection surfaces of the first strip 32 and the second strip 36.

The steps of manufacturing the composite substrate 10 are described next with reference to FIGS. 2 to 9E.

First, the substrate body 12 and the frame body 20 are prepared.

Figure 2:
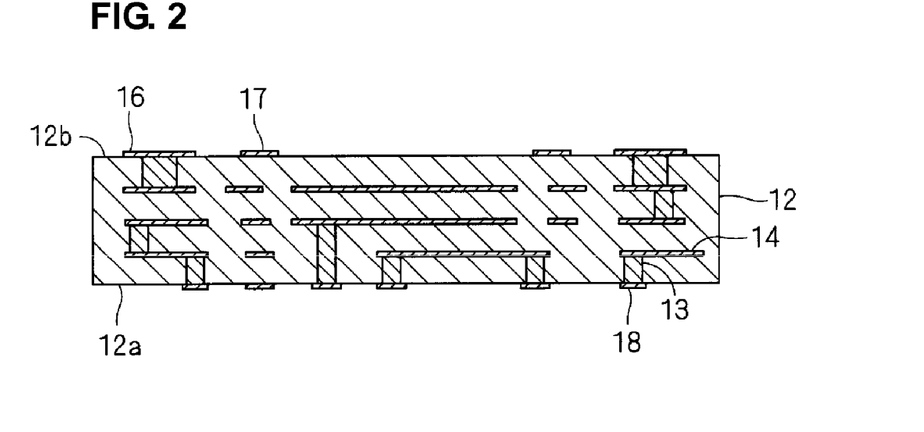
FIG. 2 is a cross-sectional view illustrating a manufacturing step of the composite substrate according to a preferred embodiment of the present invention.

When the substrate body 12 is a ceramic multilayer substrate, a plurality of ceramic layers, for example, are stacked. As shown in FIG. 2, an in-plane conductor pattern 14 and a via hole conductor pattern 13 are formed inside the substrate body 12 using conductive paste primarily including Ag, Ag/Pd, Ag/Pt, Cu, or CuO. Since low-resistance Ag or Cu is used for such a structure, signal loss can be minimized. Accordingly, such a structure is widely used for a high-frequency component and a high-frequency module. The terminal 16 and the pad 17 are formed on the first major surface 12b of the substrate body 12, while a terminal 18 defining a connection electrode (a connection land) is formed on the second major surface 12a of the substrate body 12. Ni/Sn, Ni/Au, Ni/Pd/Au, or Ni/solder is plated on the terminals 16 and 18 and the pad 17 as required.

More specifically, an unfired ceramic green sheet and a constraining film are prepared. The unfired ceramic green sheet includes the in-plane conductor pattern 14 and the via hole conductor pattern 13 formed thereon. The thickness of the unfired ceramic green sheet is in the range of about 10 μm to about 200 μm. The constraining film is fired using a temperature greater than that used for firing the ceramic green sheet. The unfired ceramic green sheet includes a low-temperature co-fired ceramic material. The temperature for firing the unfired ceramic green sheet is less than or equal to about 1,050° C. Examples of the low-temperature co-fired ceramic material include a glass-composite-based LTCC (Low Temperature Co-fired Ceramic) material generated by mixing borosilicate glass and ceramic powders, such as alumina powders or forsterite powders, a crystallized glass-based LTCC material using a $ZnO-MgO-Al_2O_3-SiO_2$ based crystallized glass, and a non-glass based LTCC material using $BaO-Al_2O_3-SiO_2$ based ceramic powder or $Al_2O_3-CaO-SiO_2-MgO-B_2O_3$ based ceramic powders. The constraining film preferably is formed from a material including alumina. Subsequently, the unfired ceramic green sheets and the constraining films are stacked in an appropriate order so that a composite lamination body including a lamination body generated by laminating a plurality of unfired ceramic green sheets and laminating the constraining films on either side of the lamination body is formed. Thereafter, the composite lamination body is fired under a firing temperature for the ceramic green sheet. The unfired constraining films are then removed from the composite lamination body. Thus, the substrate body 12 formed by firing the unfired ceramic green sheet is withdrawn.

The frame body 20 is manufactured through the steps shown in FIGS. 9A to 9E.

Figure 9A:
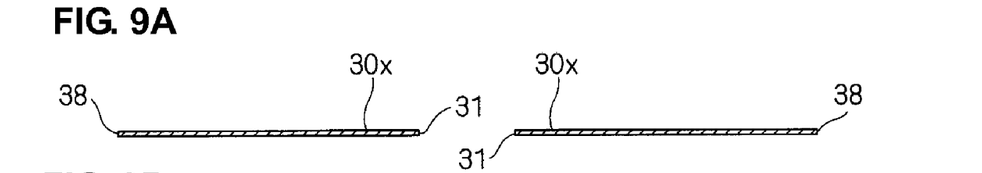
FIGS. 9A to 9E are cross-sectional views illustrating manufacturing steps of a frame body according to a preferred embodiment of the present invention.

That is, as shown in FIG. 9A, a thin metal plate formed from bronze, nickel silver, or Ni alloy, for example, is stamped out using a die. Thus, a plurality of strip-shaped sections 30x having the top ends 31 facing each other are formed.

Figure 9B:
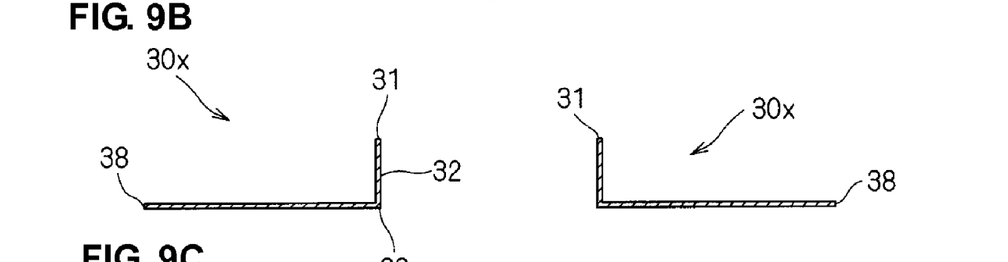

Subsequently, as shown in FIG. 9B, by bending the portions including the facing top ends 31 of the strip-shaped sections 30x at a right angle, the first bent portions 33 are formed. A portion between the top end 31 and the first bent portion 33 serves as the first strip 32.

Figure 9C:
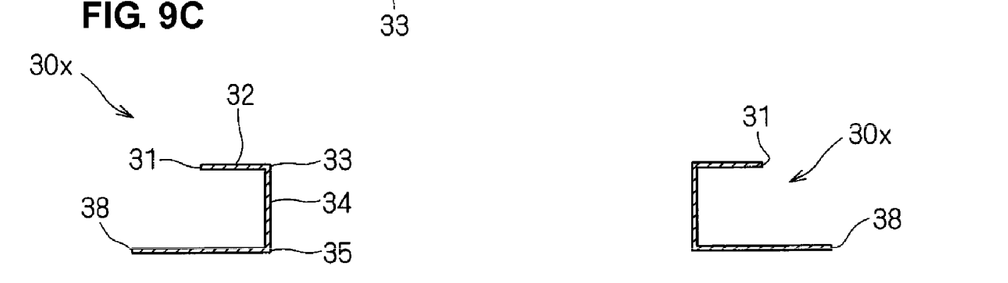

Subsequently, as shown in FIG. 9C, a portion extending from the first bent portion 33 towards a base end 38 is bent so that the second bent portion 35 is formed. A portion between the first bent portion 33 and the second bent portion 35 serves as the middle strip 34.

Figure 9D:
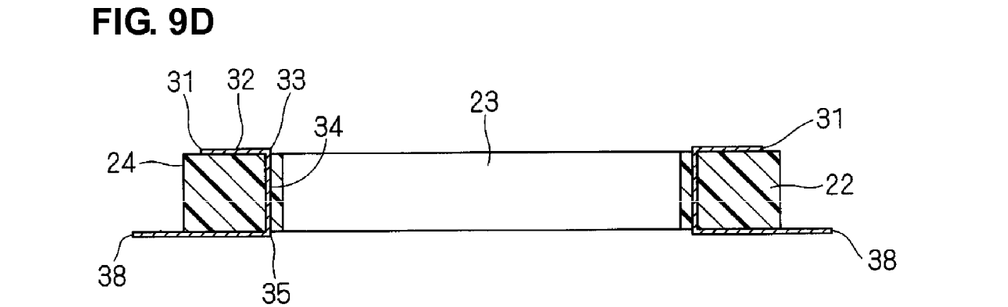

Subsequently, as shown in FIG. 9D, a resin is molded onto the strip-shaped sections 30x so that the frame member 22 having the through-hole 23 is formed. At that time, the first strip 32 located between the top end 31 and the first bent portion 33 and the portion extending from the second bent portion 35 towards the base end 38 extend along the inner surface of the die. The middle strip 34 located between the first bent portion 33 and the second bent portion 35 moves away from the inner surface of the die. In this way, resin molding is performed using injection molding of a thermoplastic resin, such as an LCP (liquid crystal polymer) or a PPS (polyphenylene sulfide), for example, or using transfer molding of a heat-curable resin, such as an epoxy resin, for example.

Figure 9E:
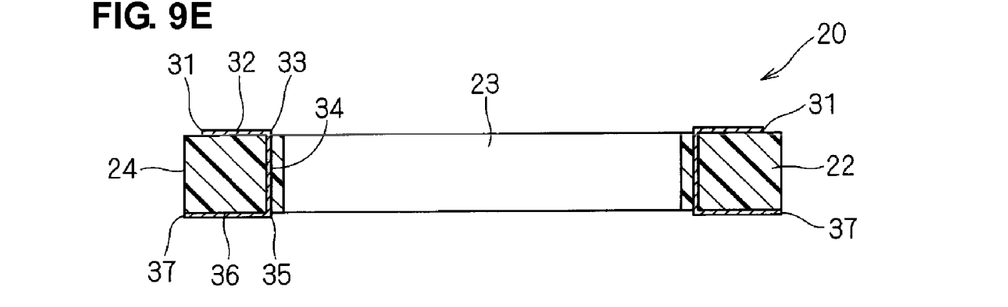

Subsequently, as shown in FIG. 9E, portions of the base ends 38 of the strip-shaped sections 30x extending beyond the molded resin (i.e., the frame member 22) are removed along the outer peripheral surface 24 of the frame member 22. Thus, the top end 37 of the second strip 36 extends to the outer peripheral surface 24 of the frame member 22.

Figure 3:
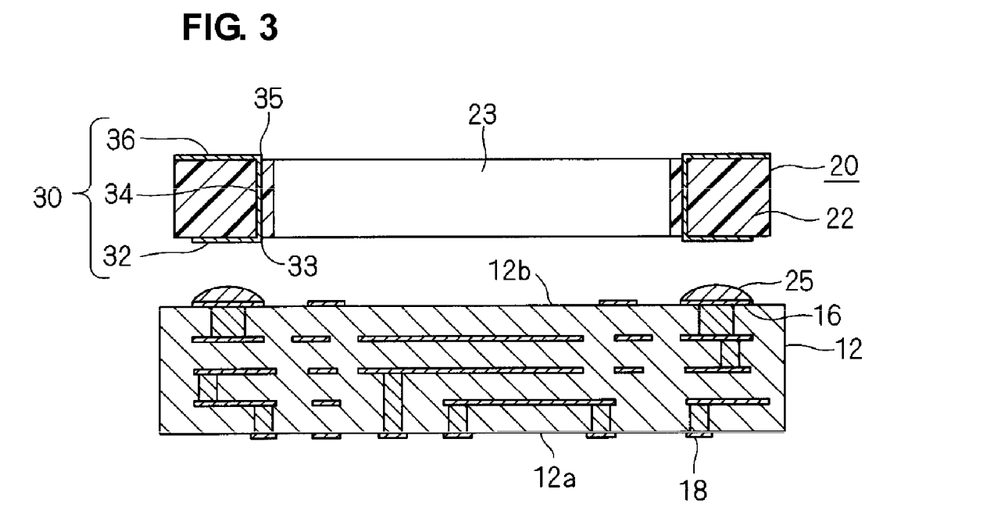
FIG. 3 is a cross-sectional view illustrating a manufacturing step of the composite substrate according to a preferred embodiment of the present invention.

Subsequently, as shown in FIG. 3, a conductive paste 25 including a solder and Ag is printed on the terminal 16 disposed on the first major surface 12b of the substrate body 12.

Figure 4:
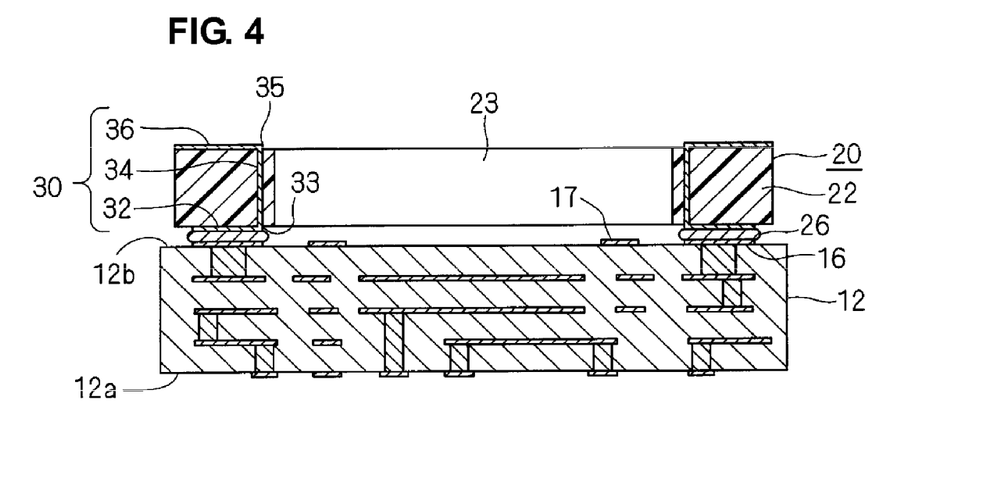
FIG. 4 is a cross-sectional view illustrating a manufacturing step of the composite substrate according to a preferred embodiment of the present invention.

Subsequently, the frame body 20 is mounted on the first major surface 12b of the substrate body 12. The conductive paste 25 is then heat cured with the first strip 32 of the connection member 30 of the frame body 20 being in contact with the conductive paste 25. Thus, as shown in FIG. 4, the substrate body 12 is connected to the frame body 20 with the solder 26 which is a cured conductive paste 25. At that time, the middle strip 34 of the connection member 30 is disposed inside the frame member 22, and the connection member 30 is not exposed on the inner surface of the through-hole 23. Accordingly, the substrate body 12 is easily connected to the frame body 20. After the substrate body 12 is connected to the frame body 20, dust and dirt deposited on the pad 17 disposed on the first major surface 12b of the substrate body 12 are removed and cleaned.

Note that, if a surface-mounted component is mounted on the first major surface 12b of the substrate body 12, the surface-mounted component can be mounted simultaneously when the frame body 20 is connected.

Figure 5:
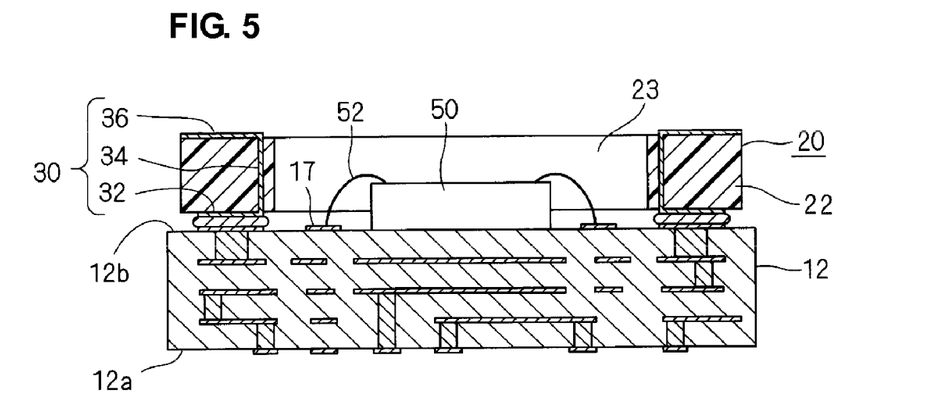
FIG. 5 is a cross-sectional view illustrating a manufacturing step of the composite substrate according to a preferred embodiment of the present invention.

Subsequently, as shown in FIG. 5, the chip electronic component 50, such as an IC or an FET, for example, is mounted on the first major surface 12b of the substrate body 12 using an epoxy resin or an electrically conductive resin, for example, through the through-hole 23 of the frame body 20. A terminal of the chip electronic component 50 is then connected to the pad 17 disposed on the first major surface 12b of the substrate body 12 using the bonding wire 52 formed from Au, Al, or Cu, for example. At that time, the middle strip 34 of the connection member 30 is disposed inside the frame member 22, and therefore, the connection member 30 is not exposed on the inner surface of the through-hole 23. Accordingly, wire bonding can be easily performed.

Figure 6:
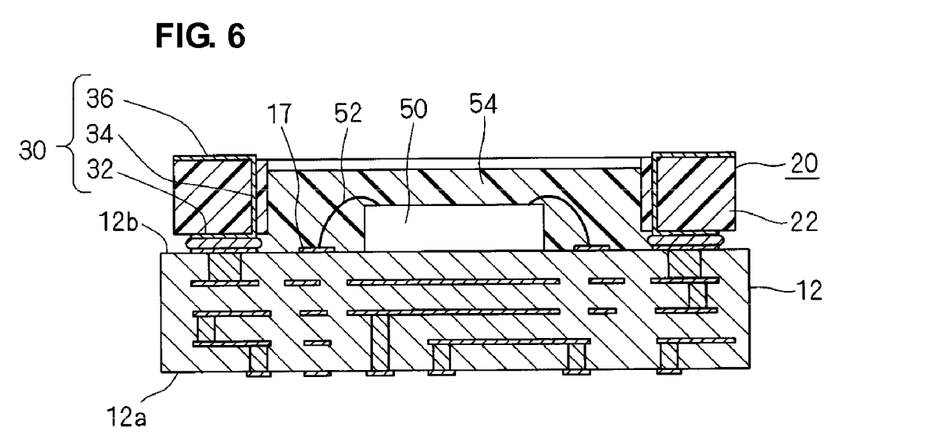
FIG. 6 is a cross-sectional view illustrating a manufacturing step of the composite substrate according to a preferred embodiment of the present invention.

Thereafter, the through-hole 23 of the frame body 20 is filled with the sealer 54, such as an epoxy resin, for example. The sealer 54 is then heat cured so that, as shown in FIG. 6, the chip electronic component 50, the bonding wire 52, and the pad 17 are covered and sealed by the sealer 54.

At that time, the height of the sealer 54 is set so as not to exceed the height of the frame body 20. In this manner, when the composite substrate 10 is connected to the external circuit substrate 60, the sealer 54 does not interfere with the connecting operation.

In addition, if the melted sealer 54 spreads onto the second strip 36 of the connection members 30 exposed from the frame member 22, a solder cannot be applied to the second strip 36, and therefore, the composite substrate 10 cannot be connected to the external circuit substrate 60. In order to prevent this failure, a mold release agent or a water repellent agent may be applied to the second strip 36 and a portion around the second strip 36.

Figure 7:
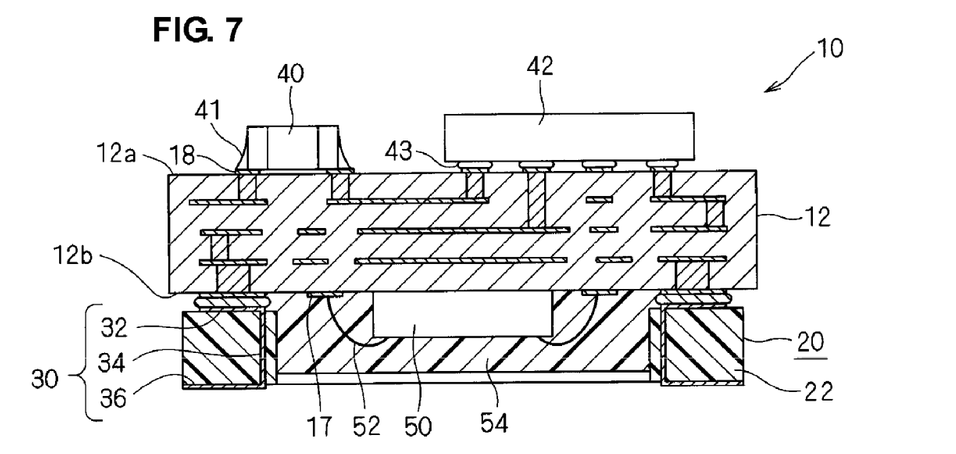
FIG. 7 is a cross-sectional view illustrating a manufacturing step of the composite substrate according to a preferred embodiment of the present invention.

As shown in FIG. 7, after the sealer 54 is cured, the composite substrate 10 is turned upside down. Thereafter, an electrically conductive paste including a solder and Ag, for example, is printed on the second major surface 12a of the substrate body 12, and the chip electronic component 40, such as a chip capacitor, is mounted on the second major surface 12a. Terminals of the chip electronic components 40 and 42 are connected to the terminals 18 disposed on the second major surface 12a of the substrate body 12 by reflow, heat curing, or flip-chip bonding, for example, of the chip electronic component 42, such as an IC chip, via a solder ball 43. A space formed between the chip electronic component 42 and the second major surface 12a of the substrate body 12, which are subjected to flip-chip bonding, is filled with an underfill resin composed of an epoxy resin, for example, as required. The underfill resin is then cured. In the case where a metal case is used, after the chip electronic components 40 and 42 are connected, a metal case formed from nickel silver or phosphor bronze, for example, is mounted on the second major surface 12a or the side surface of the substrate body 12 and is connected.

Figure 8A:
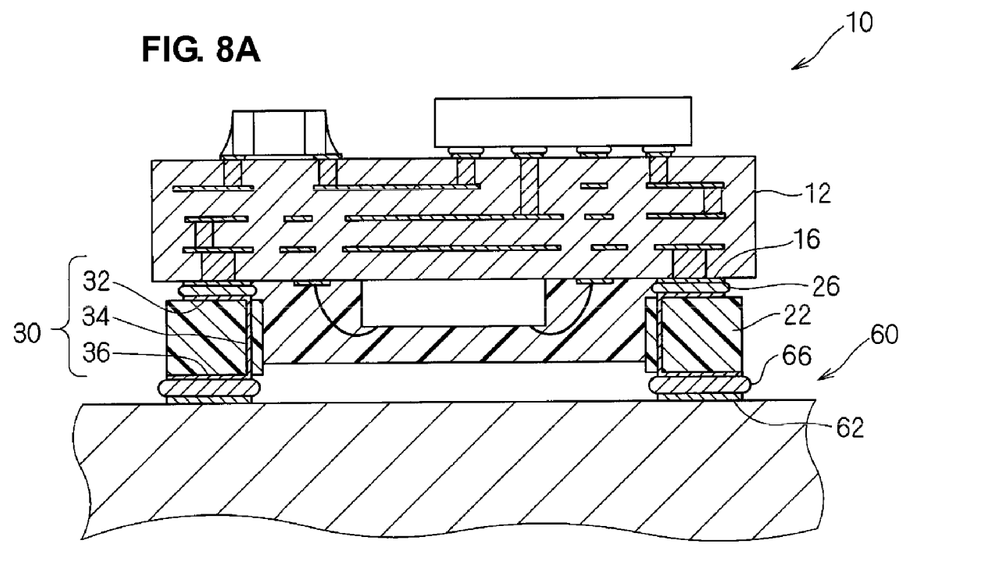
Figure 8B:
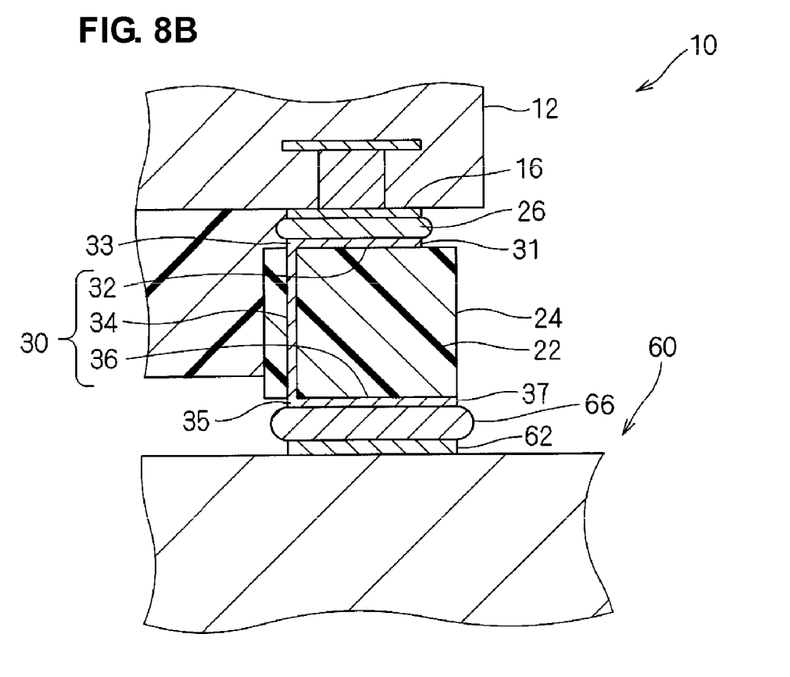

For example, as shown by the cross-sectional view in FIG. 8A and the enlarged cross-sectional view of a main portion in FIG. 8B, in order to mount the composite substrate 10 manufactured through the above-described steps on the external circuit substrate 60, the second strip 36 of the connection member 30 exposed on the surface of the frame member 22 remote from the substrate body 12 is connected to a surface electrode 62, such as a connection land, of the external circuit substrate 60, such as a printed circuit board, using a solder 66. Thus, the terminal 16 disposed on the first major surface 12b of the substrate body 12 is electrically connected to the surface electrode 62 of the external circuit substrate 60 via the solder 26, the connection member 30, and the solder 66.

The connection member 30 includes the middle strip 34 disposed inside the frame member 22, and the connection member 30 is not exposed on the inner surface of the through-hole 23. Accordingly, the chip electronic component 50 can be easily mounted on the first major surface 12b of the substrate body 12, and the frame body 20 is easily mounted on the first major surface 12b. Thus, a margin for processing (a gap for allowing a margin) can be reduced. Consequently, the size of the frame member 22 can be reduced, and therefore, the size of the composite substrate 10 can be reduced.

In addition, by bending the connection member 30 at the two bent portions 33 and 35, the middle strip 34 does not protrude outside an area between the first strip 32 and the second strip 36 facing each other. Thus, the size of the connection member 30 can be reduced.

If the connection member is bent at only one point or is continuously and plastically deformed in a circular arc shape so that the middle strip extends beyond an area between the first strip and the second strip facing the first strip, the size of the frame member may not be reduced, and therefore, the size of the composite substrate 10 may not be reduced. Accordingly, it is preferable that the connection member is bent at a plurality of points, and the bending angle is a substantially right angle. However, the present invention can be applied to even a curved bent portion.

In contrast, the connection member may have three bent points, and a middle strip may be bent inwardly towards an area between a first strip and a second strip facing each other. This is because the middle strip does not interfere with the reduction in size. For example, the middle strip may be bent in an elbowed shape so that the cross section of the middle strip is substantially Σ-shaped. By increasing the number of bent points, a combination of spring coefficients in different directions can be changed.

Since the composite substrate 10 reduces a thermal stress and a shock stress as described below, the connection reliability can be increased. In particular, when the substrate body 12 is made of a fragile ceramic multilayer substrate including glass and having a bending strength less than that of an alumina substrate, damage to the substrate body can be significantly prevented, since a thermal stress and a shock stress are reduced.

That is, since the connection member 30 is a continuous metal terminal bent so as to be plastically deformed, the connection member 30 is deformed in any one of the X, Y, and Z directions. In addition, the molded resins, that is, the frame member 22 and the connection member 30, are not directly coupled with each other. Accordingly, after resin molding is performed, the connection member 30 can be freely and plastically deformed in any one of the X, Y, and Z directions.

If the connection member 30 is plastically deformable, the connection member 30 can release thermal stress even when the thermal stress occurs due to a difference between the linear expansion coefficients α of the components of the composite substrate 10 and due to the heat generated from reflow when the frame body 20 is connected to the substrate body 12 or the composite substrate 10 is connected to the external circuit substrate 60 and due to the heat generated in a subsequent heat cycle. Similarly, shock stress, such as a shock stress caused by dropping, can be released by plastic deformation. As a result, the connection reliability can be increased.

A more detailed description is provided with reference to FIGS. 10A-10D.

As shown in FIGS. 10A to 10D, if a linear expansion coefficient $α_1$ of the substrate body 12 is less than a linear expansion coefficient $α_2$ of the external circuit substrate 60, a distance between the lower portions of the connection members 30 disposed so as to face each other through the through-hole 23, the lower portions being adjacent to the external circuit substrate 60, extends due to a temperature rise during a reflow process for, for example, connecting the composite substrate 10 to the external circuit substrate 60 or during use. Thus, a shearing force $F_S$ or a bending moment $M_S$ is generated at a connection portion between the second strip 36 of the connection member 30 and the external circuit substrate 60. The magnitude of the shearing force $F_S$ or the bending moment $M_S$ is substantially proportional to a distance L between the middle strips 34 of the connection members 30 disposed so as to face each other. As shown in the drawing, the top end 31 of the first strip 32 and the top end 37 of the second strip 36 are outwardly directed, and the two middle strips 34 are disposed in the through-hole 23 (on the inner side). Accordingly, the distance L between the middle strips 34 is less than that in the case where the top end of the first strip and the top end of the second strip are inwardly directed, and the two middle strips 34 are disposed on the side remote from the through-hole 23 (on the outer side). Therefore, the shearing force $F_S$ or the bending moment $M_S$ exerted on the connection portion between the second strip 36 of the connection member 30 and the external circuit substrate 60 is reduced. As a result, the connection reliability is increased.

Figure 10A:
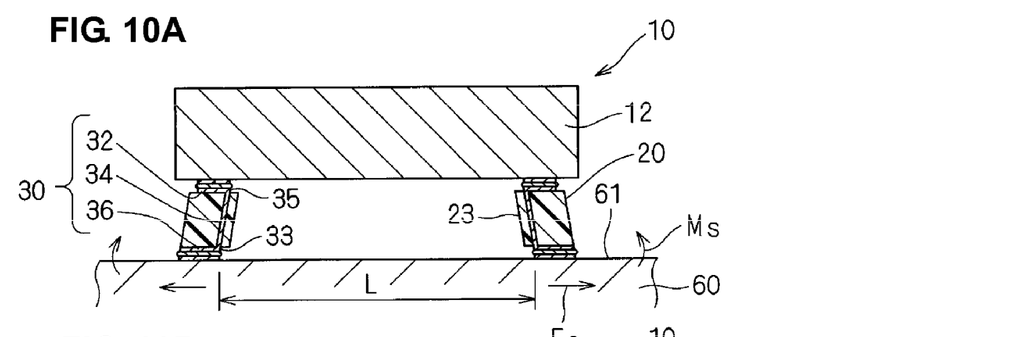
FIGS. 10A to 10D are diagrams illustrating a modification of the composite substrate according to another preferred embodiment of the present invention.

This is the same for the connection portion between the first strip 32 of the connection member 30 and the substrate body 12. If the top end 31 of the first strip 32 and the top end 37 of the second strip 36 are outwardly directed, and the two middle strips 34 are disposed in the through-hole 23 (on the inner side), the distance L between the middle strips 34 is less than that in the case where the top end of the first strip and the top end of the second strip are inwardly directed, and the two middle strips 34 are disposed on the side remote from the through-hole 23 (on the outer side). Therefore, the shearing force or the bending moment exerted on the connection portion is reduced. As a result, the connection reliability is increased.

In addition, metal is not easily bonded to resin. Accordingly, although the connection member 30 formed by bending a thin metal plate is embedded in the resin frame member 22, the connection member 30 is not bonded to the frame member 22 or the connection member 30 is easily peeled off from the frame member 22 even when the connection member 30 is bonded to the frame member 22. Thus, the connection member 30 can be easily plastically deformed.

Figure 10B:
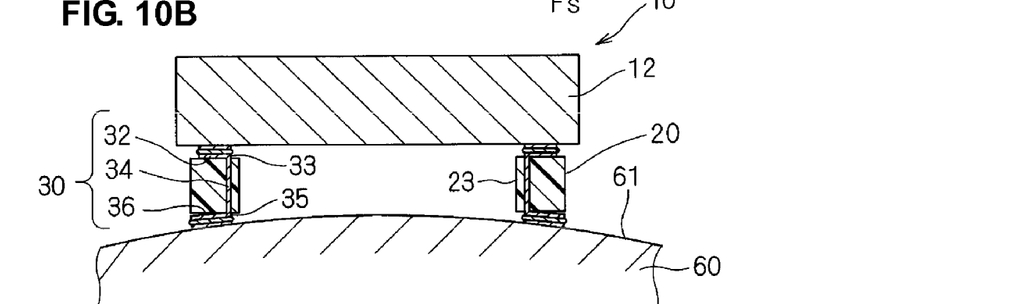

Accordingly, as shown in FIG. 10B, when a surface 61 of the external circuit substrate 60 is convexly curved towards the composite substrate 10, the second strip 36 of the connection member 30 substantially rotates about the second bent portion 35 and is plastically deformed so that a gap is formed between the second strip 36 and the frame member 22. Accordingly, an excessive force exerted to the connection portion between the second strip 36 of the connection member 30 and the external circuit substrate 60 can be prevented. As a result, the connection reliability can be increased.

In addition, in the connection portion between the first strip 32 of the connection member 30 and the substrate body 12, the first strip 32 of the connection member 30 attempts to substantially rotate about the first bent portion 33 so as to move away from the substrate body 12. However, this rotation is prevented by the frame member 22. Thus, an excessive force exerted to the connection portion between the first strip 32 of the connection member 30 and the substrate body 12 can be prevented.

Figure 10C:
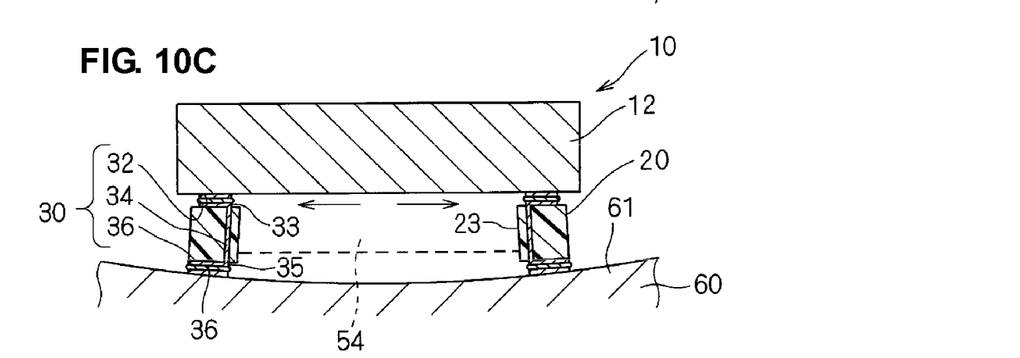

Furthermore, as shown in FIG. 10C, when the surface 61 of the external circuit substrate 60 is concavely curved so as to move away from the composite substrate 10, the magnitudes of forces exerted to the connection portions between the second strip 36 of the connection member 30 and the external circuit substrate 60 and between the first strip 32 of the connection member 30 and the substrate body 12 can be reduced due to the plastic deformation of the frame member 22 and the plastic deformation of the connection member 30.

At that time, a stress is concentrated on the first bent portion 33 and a portion near the first bent portion 33 of the connection member 30. However, if the sealer 54 is present, the sealer 54 reinforces the connection between the frame member 22 and the substrate body 12. Thus, the concentration of the stress is reduced, and therefore, the connection reliability can be increased.

Figure 10D:
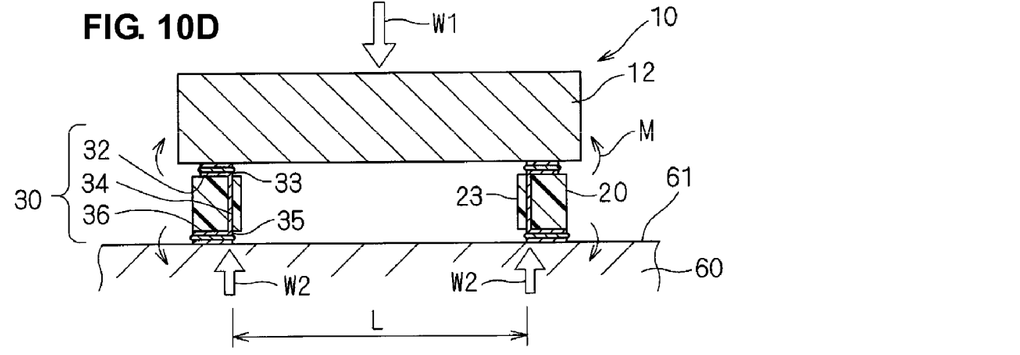

In addition, as shown in FIG. 10D, when the composite substrate 10 is mounted on the external circuit substrate 60 or a dropping shock is applied to the composite substrate 10, a pressing force W1 is applied to substantially the center of the composite substrate 10 and the external circuit substrate 60, the pressing force W1 is substantially balanced by a reaction force W2 transferred via the middle strip 34 of the connection member 30. At that time, since the positions on which the pressing force W1 and the reaction force W2 are exerted are shifted from each other, a bending moment M is generated. The bending moment M acts on the connection portions between the second strip 36 of the connection member 30 and the external circuit substrate 60 and between the first strip 32 of the connection member 30 and the substrate body 12. The magnitude of the bending moment M is substantially proportional to the distance L between the middle strips 34 of the connection members 30 disposed so as to face each other with the through-hole 23 therebetween.

Accordingly, as in the case shown in FIG. 10A, the distance L between the middle strips 34 is reduced. That is, since the top end 31 of the first strip 32 and the top end 37 of the second strip 36 of the connection member 30 are outwardly directed, and the two middle strips 34 are disposed in the through-hole 23 (on the inner side), the bending moment M acting on the connection portions can be reduced, and therefore, the connection reliability can be increased.

The connection member 30 can be formed using a method other than the method for bending a thin metal plate. That is, a method in which a through-hole is formed in the frame member 22, and components corresponding to the first strip 32 and the second strip 36 and a metal film electrically connecting the components with each other are formed in the through-hole by plating may be used.

However, for example, when the components are formed by plating and if a plating solution remains in the through-hole, the remaining plating solution may evaporate in the step of connecting the frame body 20 to the substrate body 12 and the step of connecting the composite substrate 10 to the external circuit substrate 60. In such a case, the evaporating plating solution may abruptly expand. Thus, cracks may be generated around the through-hole, and a void may be generated in the solder. In contrast, when the connection member 30 is formed by bending a thin metal plate, such a defect does not occur, and therefore, the connection reliability can be increased.

In addition, when a through-hole is drilled and the inner peripheral surface is plated, the processing operation is difficult to perform if the diameter of the through-hole is less than or equal to about 100 μm. However, if the connection member 30 is formed by bending a thin metal plate, the processing operation is easily performed even when the thickness of the thin metal plate is reduced to about 50 μm. Furthermore, the dimensions required around the through-hole in the case of forming the connection member 30 by bending a thin metal plate can be decreased as compared to the case of drilling a through-hole and plating the inner peripheral surface. Accordingly, by forming the connection member 30 using a bending process of a thin metal plate, the size of the connection member 30 can be easily decreased.

Furthermore, by forming the connection member 30 by performing a bending process on a thin metal plate and molding a resin so as to cover the connection member 30, the processing steps are simplified, and therefore, the manufacturing cost can be reduced.

Still furthermore, by connecting the substrate body 12 to the external circuit substrate 60 using the connection member 30 formed through a bending process, a stress is released by elastic deformation of a metal, and therefore, the strength can be increased.

Yet still furthermore, a larger variety of materials can be used to form the thin metal plate used for the connection member 30 than in the case of forming the connection member 30 by plating. The resin of the frame member 22 need not be firmly connected to the metal of the connection member 30. Accordingly, the material of the resin used for the frame member 22 can be selected from among a variety of types of material. Therefore, a low-cost material, an easy-to-bend material, or an easy-to-mold material can be selected from a variety of types of material. Thus, this method is industrially useful.

Modifications of the preferred embodiments are described next with reference to FIGS. 11 to 13.

First Modification

Figure 11:
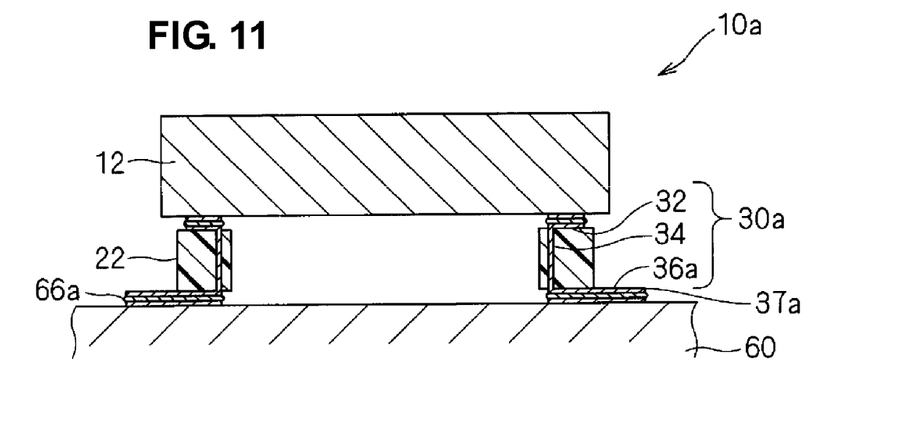
FIG. 11 is a cross-sectional view illustrating the structure of a composite substrate (modification 1).

In a composite substrate 10a shown by the cross-sectional view in FIG. 11, a top end 37a of a second strip 36a of a connection member 30a for connecting the composite substrate 10a to the external circuit substrate 60 extends beyond the outer peripheral surface 24 of the frame member 22. Accordingly, the size of a connection portion 66a between the second strip 36a and the external circuit substrate 60 can be increased, and therefore, the connection strength between the composite substrate 10a and the external circuit substrate 60 can be increased.

Second Modification

Figure 12:
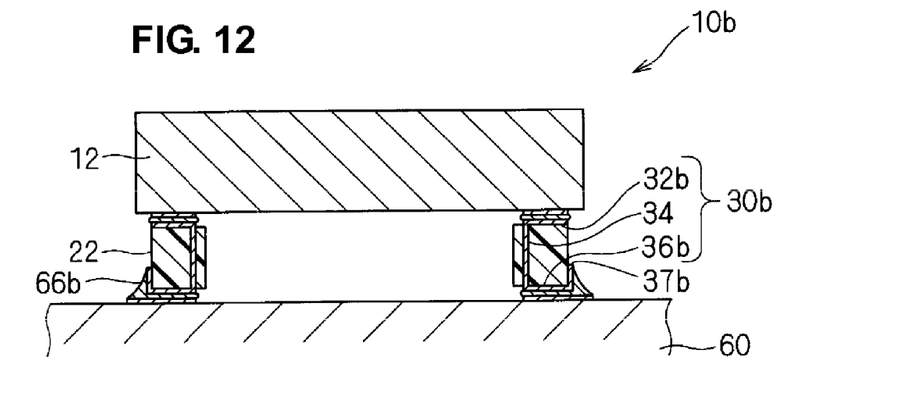
FIG. 12 is a cross-sectional view illustrating the structure of a composite substrate (modification 2).

In a composite substrate 10b shown by the cross-sectional view in FIG. 12, a portion near a top end 37b of a second strip 36b of a connection member 30b for connecting the composite substrate 10b to the external circuit substrate 60 is bent and extends along the outer peripheral surface 24 of the frame member 22. Since a solder 66b used for connecting the composite substrate 10b to the external circuit substrate 60 rises along a portion near the top end 37b of the bent second strip 36b, the solder 66b for joining the external circuit substrate 60 to the composite substrate 10b can be easily verified from the outside.

Third Modification

Figure 13:
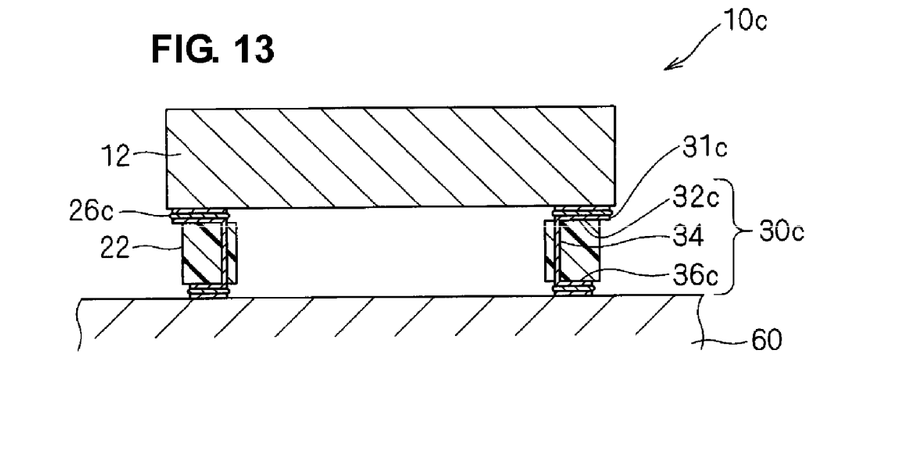
FIG. 13 is a cross-sectional view illustrating the structure of a composite substrate (modification 3).

In a composite substrate 10c shown by the cross-sectional view in FIG. 13, in contrast to the above-described preferred embodiments, a first strip 32c of a connection member 30c connected to the substrate body 12 is longer than a second strip 36c of the connection member 30c connected to the external circuit substrate 60. In this case, a top end 31c of the first strip 32c of the connection member 30c may extend to the outer peripheral surface 24 of the frame member 22 or may extend beyond the outer peripheral surface 24 of the frame member 22. In the composite substrate 10c, the size of a connection portion 26c between the first strip 32c of the connection member 30c and the substrate body 12 can be increased, and therefore, the connecting capability between a frame body 20c and the substrate body 12 can be improved.

Fourth Modification

Figure 14:
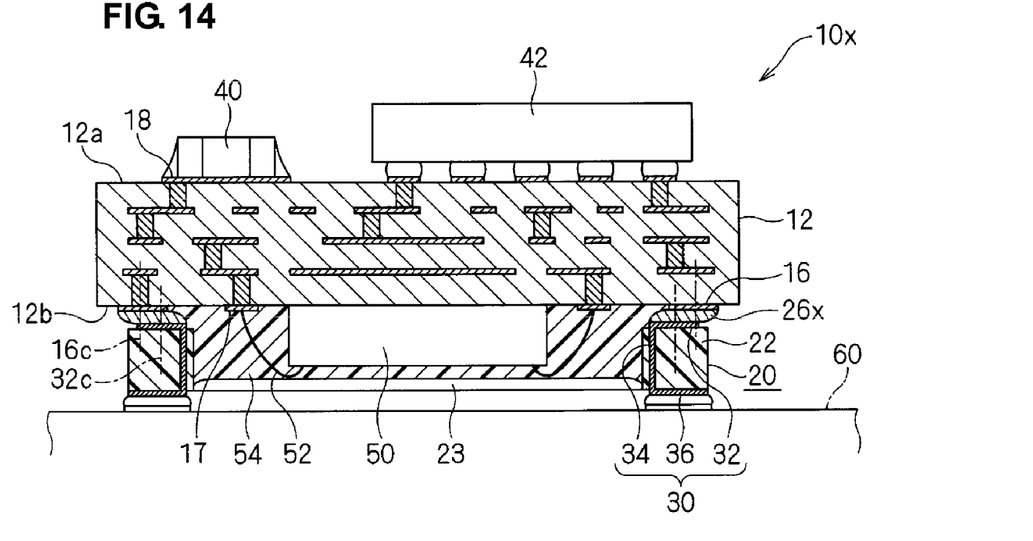
FIG. 14 is a cross-sectional view illustrating the structure of a composite substrate (modification 4).
Figure 15:
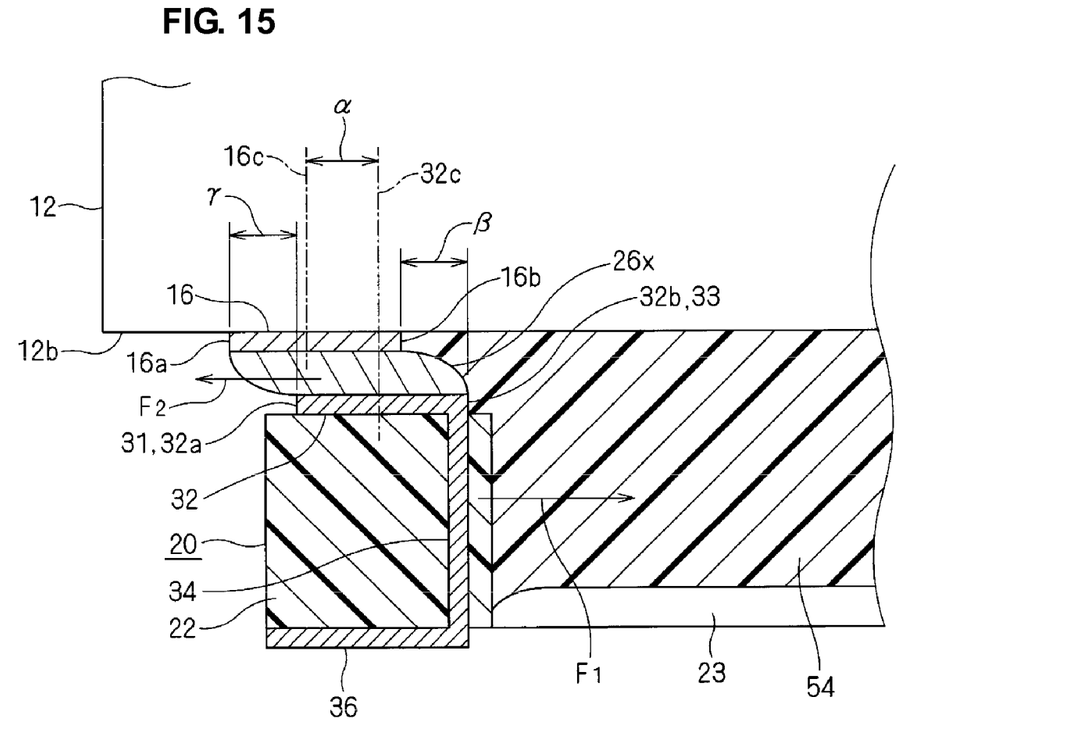
FIG. 15 is an enlarged cross-sectional view of a main portion representing a connection portion of the composite substrate (modification 4).

In a composite substrate 10x shown by the cross-sectional view in FIG. 14 and the enlarged cross-sectional view of a main portion in FIG. 15, the structure of a connection portion between the substrate body 12 and the frame body 20 is different from that of the above-described preferred embodiments. However, the structures of the substrate body 12 and the frame body 20 are the same as those of the above-described preferred embodiments.

That is, unlike the above-described preferred embodiments, the locations of the terminal 16 of the substrate body 12 and the first strip 32 of the connection member 30 of the frame body 20 are shifted relative to each other. More specifically, the terminal 16 of the substrate body 12 is relatively and outwardly shifted from the center of the composite substrate 10x, while the first strip 32 of the connection member 30 of the frame body 20 is relatively and inwardly shifted towards the center of the composite substrate 10x. Accordingly, an electrically conductive connecting material (e.g., a solder) 26x used for joining the terminal 16 to the first strip 32 has a form extending in the width direction (a left-right direction in FIG. 15).

As shown in FIG. 15, it is preferable that a center 32c of the first strip 32 on the frame body 20 is shifted inwardly from a center 16c of the terminal 16 of the substrate body 12 (towards the through-hole 23 of the frame body 20) by a distance α (α>0).

When a cavity (primarily the through-hole 23 of the frame body 20) formed by the substrate body 12 and the frame body 20 is filled with a sealing resin 54, and the sealing resin 54 is cured, a curing contraction stress $F_1$ of the sealing resin 54 acts in a direction in which all sides of the frame member 22 of the frame body 20 are inwardly attracted. In addition, when the electrically conductive connecting material 26x used for connecting the frame body 20 to the substrate body 12 is cured, a curing contraction stress is produced. If the center 32c of the first strip 32 of the connection member 30 is disposed so as to be inwardly shifted from the center 16c of the terminal 16 of the substrate body 12, a curing contraction stress $F_2$ of the conductive connecting material 26x acts in a direction in which the first strip 32 of the connection member 30 on the frame body 20 is outwardly attracted. Accordingly, the curing contraction stress $F_1$ of the sealing resin 54 can be reduced by the curing contraction stress $F_2$ of the electrically conductive connecting material 26x. Thus, the effect caused by the contraction stress of the sealing resin 54 can be reduced. As a result, deformation of the frame body 20 caused by the curing contraction of the sealing resin 54 can be prevented, and therefore, the connection reliability between the frame body 20 and the substrate body 12 can be improved.

In addition, in such a structure, since a compression stress acts on the substrate body 12 in an inward direction (a direction towards the center of the substrate body 12) when the electrically conductive connecting material 26x is cured, the deflecting strength of the substrate body 12 formed from ceramic can be increased.

Furthermore, it is preferable that an inner edge 32b of the first strip 32 on the frame body 20 is shifted inwardly from an inner edge 16b of the terminal 16 of the substrate body 12 (towards the through-hole 23 of the frame body 20) by a distance β (β>0).

When the inner edge 32b of the first strip 32 is inwardly shifted from the inner edge 16b of the terminal 16, the electrically conductive connecting material 26x is extended in the width direction in a region between the inner edge 16b of the terminal 16 and the inner edge 32b of the first strip 32 and, subsequently, is cured. Accordingly, the curing contraction stress $F_2$ of the electrically conductive connecting material 26x can be increased. As a result, the curing contraction stress $F_1$ of the sealing resin 54 can be effectively reduced by the curing contraction stress $F_2$ of the electrically conductive connecting material 26x.

Still furthermore, it is preferable that a leading edge 32a of the first strip 32 on the frame body 20 (the top end 31 of the connection member 30) is shifted inwardly (towards the through-hole 23 of the frame body 20) from an outer edge 16a of the terminal 16 of the substrate body 12 by a distance γ (γ>0).

If the leading edge 32a of the first strip 32 is shifted from the outer edge 16a of the terminal 16 towards the outside of the frame body 20 (in a direction away from the through-hole 23 of the frame body 20), the top end 31 of the first strip 32 is pulled towards the inside of the frame body 20 (in a direction towards the bent portion 33 of the connection member 30). Accordingly, the top end 31 of the first strip 32 is separated from the frame member 22, and therefore, the connection between the frame body 20 and the substrate body 12 may become unstable or the connection strength between the frame body 20 and the substrate body 12 may be decreased. In contrast, if the leading edge 32a of the first strip 32 is shifted from the outer edge 16a of the terminal 16 towards the inside of the frame body 20, the top end 31 of the first strip 32 is pulled towards the outside of the frame body 20 (in a direction away from the bent portion 33 of the connection member 30). Accordingly, the top end 31 of the first strip 32 is firmly connected to the frame member 22, and therefore, the connection between the frame body 20 and the substrate body 12 becomes stable. Thus, the connection strength between the frame body 20 and the substrate body 12 becomes stable.

As described above, by joining the composite substrate 10 to the external circuit substrate 60 via the frame body 20 having the bent connection member 30 embedded in the frame member 22, a thermal stress or a shock stress can be reduced using a simple structure. In this case, by arranging the connection members 30 facing each other with the through-hole 23 of the frame member 22 therebetween so that the top end 31 of the first strip 32 and the top end 37 of the second strip 36 are directed outwardly and the middle strips 34 are disposed inside the through-hole 23 (on the inner side), a shearing force or a bending moment acting on the connection portion between the composite substrate 10 and the external circuit substrate 60 and the connection portion between the substrate body 12 and the frame body 20 in the composite substrate 10 can be minimized. Thus, the connection reliability can be improved.

It should be understood that the present invention is not limited to the above-described embodiment, but a variety of modifications can be made to the described embodiment.

For example, any "substrate body" that includes a plurality of terminals connected to the frame body and disposed in the same plane can be used. In addition, a protrusion or a recess may be provided in an area of the substrate body other than the planar surface area to which the frame body is connected.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A composite substrate comprising:
   a substrate body having a terminal on at least a first major surface thereof; and
   a frame body connected to the first major surface of the substrate body, the frame body including a frame member made of an insulating material and a plurality of connection members defined by bent thin metal plates, the frame member having a through-hole at an approximate center thereof and extending along a peripheral portion of the first major surface of the substrate body so as to have a frame shape, each of the plurality of connection members having a first strip and a second strip continuously connected to opposed ends of a middle strip; wherein
   the plurality of connection members are disposed in the frame member so as to face each other with the through-hole of the frame member therebetween, the first strip is exposed on the frame member towards the substrate body and is connected to the terminal on the first major surface of the substrate body, the second strip is exposed on the frame member to a side remote from the substrate body, the first and second strips extend in a direction in which the connection members face each other with the through-hole of the frame member therebetween, the middle strip extends through an inside of the frame member, and the opposed end of the middle strip are continuously connected to an end of the first strip and an end of the second strip on the side adjacent to the through-hole of the frame member.

2. The composite substrate according to claim 1, wherein a chip electronic component is disposed in the through-hole of the frame member and is mounted on the first major surface of the substrate body.

3. The composite substrate according to claim 2, wherein the chip electronic component is sealed with a resin, and the resin is bonded to or in contact with a portion of the frame body.

4. The composite substrate according to claim 1, wherein the connection members in the frame body are made of a stamped and bent metal plate, and the frame member of the frame body is made of a resin that is molded with the connection members.

5. The composite substrate according to claim 4, wherein the metal plate of the connection member in the frame body is flexible.

6. The composite substrate according to claim 1, wherein the substrate body is a ceramic substrate.

7. The composite substrate according to claim 1, wherein the substrate body is a ceramic multilayer substrate including a plurality of stacked ceramic layers having a firing temperature of about 1,050° C. or less.

8. The composite substrate according to claim 1, wherein the thickness of the connection member is in a range of about 50 μm to about 300 μm.

9. The composite substrate according to claim 1, wherein a chip electronic component is mounted on a second major surface of the substrate body opposed to the first major surface of the substrate body.

10. The composite substrate according to claim 1, wherein a top end of the second strip of the connection member on the frame body extends at least to an outer peripheral surface of the frame member.

11. The composite substrate according to claim 1, wherein a top end portion of the second strip of the connection member on the frame body is bent and extends along an outer peripheral surface of the frame member.

12. The composite substrate according to claim 1, wherein an area of the first strip of the connection member on the frame body is greater than an area of the second strip.

13. The composite substrate according to claim 1, wherein a location of a center of the first strip of the connection member on the frame body is shifted from a location of a center of the terminal of the substrate body towards the through-hole of the frame body.

14. The composite substrate according to claim 1, wherein a location of an inner edge of the first strip of the connection member on the frame body adjacent to the through-hole of the frame body is shifted from a location of an inner edge of the terminal of the substrate body adjacent to a center of the substrate body towards the through-hole of the frame body.

15. The composite substrate according to claim 1, wherein a location of a leading edge of the first strip of the connection member on the frame body remote from the through-hole of the frame body is shifted from a location of an outer edge of the terminal of the substrate body remote from a center of the substrate body towards the through-hole of the frame body.

* * * * *